United States Patent
Bolotov et al.

(10) Patent No.: US 10,725,861 B2
(45) Date of Patent: Jul. 28, 2020

(54) ERROR CORRECTION CODE MEMORY SECURITY

(71) Applicant: Intel Corporation, Santa Clara, CA (US)

(72) Inventors: Anatoli Bolotov, San Jose, CA (US); Mikhail Grinchuk, San Jose, CA (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 16/022,447

(22) Filed: Jun. 28, 2018

(65) Prior Publication Data

US 2019/0042362 A1 Feb. 7, 2019

(51) Int. Cl.
| | |
|---|---|
| *G06F 11/10* | (2006.01) |
| *H03M 13/11* | (2006.01) |
| *G06F 3/06* | (2006.01) |
| *G11C 7/24* | (2006.01) |
| *H03M 13/00* | (2006.01) |
| *G11C 29/52* | (2006.01) |
| *G11C 29/04* | (2006.01) |

(52) U.S. Cl.
CPC .......... *G06F 11/1068* (2013.01); *G06F 3/064* (2013.01); *G06F 3/0619* (2013.01); *G06F 3/0673* (2013.01); *G06F 11/1044* (2013.01); *G11C 7/24* (2013.01); *H03M 13/1102* (2013.01); *H03M 13/63* (2013.01); *G11C 29/52* (2013.01); *G11C 2029/0411* (2013.01); *H03M 13/618* (2013.01)

(58) Field of Classification Search
CPC .................................................... G06F 11/1068
USPC ........................................ 714/764, 767, 770
See application file for complete search history.

(56) References Cited

U.S. PATENT DOCUMENTS

| | | | | |
|---|---|---|---|---|
| 5,701,516 | A | * 12/1997 | Cheng ................. | G06F 12/0804 710/22 |
| 7,454,668 | B1 | * 11/2008 | Yochai ................ | G06F 11/1435 714/52 |
| 2011/0131374 | A1 | * 6/2011 | Noeldner ............... | G06F 12/00 711/114 |
| 2016/0283748 | A1 | 9/2016 | Oh et al. | |
| 2017/0285976 | A1 | * 10/2017 | Durham .................. | G06F 21/79 |
| 2019/0050347 | A1 | * 2/2019 | Bolotov .................. | G06F 21/78 |
| 2019/0095350 | A1 | * 3/2019 | Durham .................. | G06F 21/53 |

OTHER PUBLICATIONS

Gueron, S, "A memory encryption engine suitable for general purpose processors", Cryptology ePrint Archive, eport 2016 204, (2016), 14 pgs.

\* cited by examiner

*Primary Examiner* — Fritz Alphonse
(74) *Attorney, Agent, or Firm* — Schwegman Lundberg & Woessner, P.A.

(57) ABSTRACT

System and techniques for error correction code (ECC) memory security are described herein. A write request that includes data is received. An integrity check value (ICV) is computed for the data. Then, the write request is performed, including writing a representation of the data to a data area in memory and writing the ICV into an ECC area in memory. Here, the data area is addressable by a host and the ECC area corresponds to the data area via hardware of the memory.

24 Claims, 9 Drawing Sheets

ERROR CORRECTION CODE MEMORY SECURITY

TECHNICAL FIELD

Embodiments described herein generally relate to memory devices and more specifically to error correction code (ECC) memory security.

BACKGROUND

Computer systems have become a part of everyday life. As computer systems are found in more devices in a greater number of critical roles, data integrity, including security, has become a greater issue for systems designers. Security threats generally seek to gain control of the system or information held thereon. While tools such as encrypting network traffic have been effective at counteracting security threats originating from outside of a given system, some threats attack the heart of the computer system by attempting to glean information directly from the computer system's processors or operating memory (e.g., memory used to hold a current system state, such as random-access memory (RAM) or the like).

The number of hardware attacks (both invasive and non-invasive) are growing, hoping to gain access to the large amount of sensitive data on computer systems that may be held outside of a processor's trusted zone (e.g. in dynamic RAM (DRAM)). To combat these threats, secure architectures and cryptographic methods are implemented to protect memory operations to prevent an intruder from maliciously tampering with, or gaining access to, the data stored in the memory. The secure architectures generally use three cryptographic primitives: confidentiality; integrity; and freshness.

Confidentiality ensures the privacy of data by encrypting data before it is written to the memory and decrypting the data from the memory. Integrity ensures that the saved data has not been modified (e.g., corrupted or adulterated). Freshness ensures that data is versioned such that old data cannot be reused (e.g., it prevent replay attacks in which valid, but old data is used by an attacker).

In addition to security, protection against data corruption, such as may be caused by energized particles, has also been employed in memories. Memory is often designed as a combination of a controller and data storage. A requesting entity (e.g., user, program, host, etc.) sends read or write requests to a controller, which then stores the data on the storage medium. Operationally, memory is exposed as an array of addressable blocks of a given size (e.g., 512 bits). Read and write operations generally involve one or more addresses being given to the controller, the controller then transforming each request to one or more requests to the data storage. As part of this transformation, the controller may modify the data by, for example, encrypting the data or computing error correction codes (ECCs).

The data storage is often viewed as an array of storage blocks, with basic operations that include reading and writing an entire block at a time. ECC memory typically includes additional space to hold ECCs, resulting in larger storage blocks for the basic operations. For example, a storage block may contain 512 bits for the data and 64 or 128 bits for the ECC data. Generally, the storage is designed such that the additional ECC area is retrieved along with the data (e.g., via a parallel integrated circuit (IC) tied to the storage block address, or via larger storage blocks, etc.). The ECC codes generally provide error detection, and possibly error recovery. In some cases, the controller performs the error detection or correction based on the ECC codes as part of satisfying a read request.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
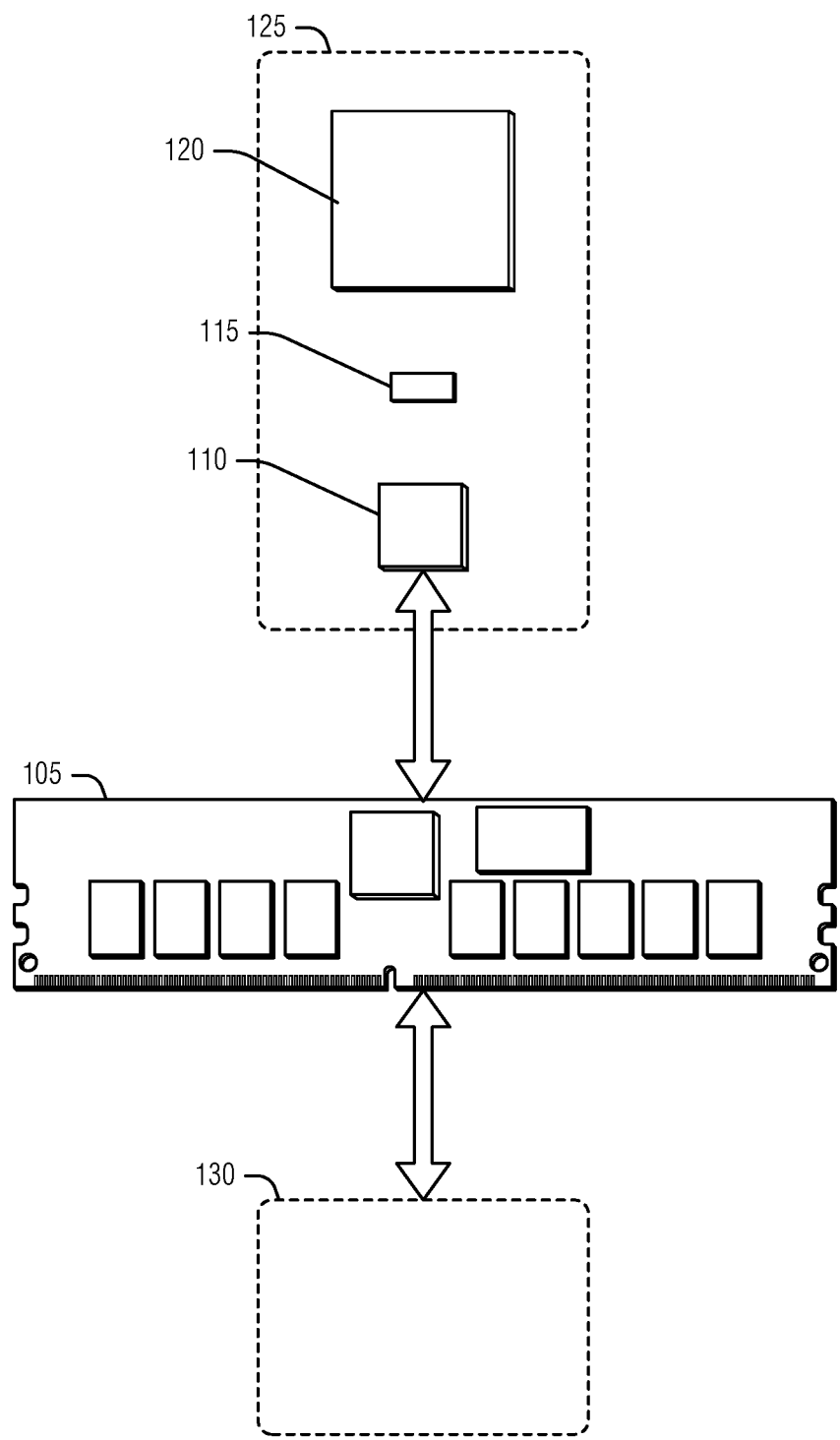
FIG. 1 is a block diagram of an example of an environment including a system for ECC memory security, according to an embodiment.

Generally, when security techniques are applied to ECC memories, the integrity protection is a separate and independent implementation of integrity protection. For example, integrity protection may be implemented by a hash function h. Here, each data word W is accompanied by an integrity check value (ICV) that depends on W, and optionally on other parameters, such as address A, key K, nonce N, etc. In this example, the ICV is the result of h(W, A, K, N). ICVs are generally smaller than data (e.g., ICVs may be 32 bits or 64 bits) and are grouped into the words of the same size as data words (e.g., 512 bits) that are stored in a data area that is tied to the address of the data word (e.g., cache line) to which they pertain. Thus, an ICV related to a data word stored at address A is part of a word at some address A' which depends on A.

Generally, an authenticated memory access conforms to the following script (some operations may be performed in parallel):

```
Read operation at address A:
    fetch W = MEM[A]
        // including error correction and decryption
    compute ICV = h(W, A, K, N)
```

```
compute A' based on A
fetch W' = MEM[A']
    // also including error correction and
    // decryption
extract STORED_ICV from W'
    // location inside W' depends on address A
if (ICV == STORED_ICV)
    return W
        // authentication passed
        // and W is the result of the read
        // operation
else
    report authentication failure
```

A write operation example is as follows:

```
Write operation at address A:
    write input data W into MEM[A]
        // including computation of parity bits
        // and encryption
    compute ICV = h(W, A, K, N)
    compute A' based on A
    fetch W' = MEM[A']
        // including error correction and decryption
    replace specific part of W' by ICV
        // location inside W' depends on address A
    write W' into MEM[A']
        // including computation of parity bits
        // and encryption
```

Note that each read operation uses two memory reads (one for the data and one for the ICV), and each write operation uses two memory writes (one for the data and one for the ICV) and one memory read (to retrieve the cache line where the ICV is stored).

For an appropriately chosen h, the technique above protects against spoofing attacks—e.g., replacing data W at address A by a malicious value MW—because it's computationally infeasible to find values for MW that satisfy h(W, A, K)=h(MW, A, K) if attacker does not know key K and the function h is a one-way cryptographic function. The described technique also protects against splicing attacks—e.g., replacing data W at address A by a maliciously copied value MW from address B for the reasons given above. To protect against replay attacks—replacing data W at address A with malicious data MW which has been previously stored at address A—the ICV data may be protected by higher level ICVs, the last level of which is kept on the controller (e.g., in on-chip static RAM (SRAM)). Some refer to this as an integrity tree (e.g., a Merkle tree).

Although these techniques may effectively counter security risks, they often degrade memory performance and may involve a high storage overhead. Due to these performance problems, some have reduced the security of memory systems, opting instead for a "better than nothing" approach, which may include heuristic methods to detect data alternations or to avoid multiple read operations with memory (e.g., to ensure the integrity of data).

To address these problems, ECC capabilities of memory hardware are leveraged to implement integrity checks. The ECC area of memory is used to hold ICV data instead of, or in addition to, ECC data. Data integrity assumes that data read from memory is accurate and reliable and has not been changed by an unauthorized party. Though integrity is not the same thing as error detection and correction (ECCs deal with soft or hard errors and do not contemplate any malicious activity) the detection of data alteration is common to both facilities. Thus, an integrity check that passes also means that there is no error (e.g., an ECC check would also pass). Because ICV checks are always run, and error correction is run only when an ECC check fails, it is more efficient to use the ECC area of ECC memory to simultaneously retrieve the ICV for a data word upon reading, because the ECC retrieval will be unnecessary in most cases. In an example, the ECC may be shortened and stored along with the ICV in the ECC area, or the ECC may be stored in a different data area (such as described above with respect to traditional ICV implementations). These arrangements result in a fast and efficient combination of integrity checking and error correction that doesn't involve a drastic re-design of memory controllers. Additional details and examples are described below.

FIG. 1 is a block diagram of an example of an environment including a system 125 for ECC memory security, according to an embodiment. The system 125 represents a secure, or trusted, zone of a computer system. The system includes a processor 120, cache 115 (e.g., used to speed processor access to frequently used data), and a memory controller 110. The memory controller 110 is connected to a memory 105.

The memory 105 is ECC memory, which is designed to support error detection and correction by including dedicated hardware (e.g., storage, bandwidth, etc.) to enable the retrieval of ECC data along with user data. This may be accomplished via a dedicated IC on the memory 105 to store ECC data, via physical cache lines that are greater than a cache line addressable by the processor 120, or via several other techniques (e.g., memory array striping, etc.). As used herein, a data area is addressable by host devices, and an ECC area is a portion of the memory 105 correlated to a data area (e.g., via the dedicated hardware). In an example, the ECC area is retrieved simultaneously (e.g., without additional requests to the memory 105) with its corresponding data area. In an example, the ECC area is not directly addressable by the host.

The environment contemplates malicious devices 130 that may access the memory 105 via software or hardware. To prevent the unauthorized access to, or tampering with, data in the memory 105 by the malicious devices 130 the memory controller 110 is configured to implement ECC memory security. To accomplish ECC memory security, the memory controller 110 is arranged to receive a write request, such as from the processor 120 or other device of a host system (e.g., another piece of hardware via a direct memory access (DMA) interface). The write request may originate from a user, program, etc. The write request includes data that the requestor intends to store in the memory 105. In an example, the data is a data word, or cache line, of the memory 105. In an example, the cache line is 512 bits.

The memory controller 110 is arranged to compute an ICV for the data of the request. Any ICV technique may be used, including the hash function based techniques described above. In an example, the ICV is 32 bits. In an example, the ICV is 64 bits. Generally, the ICV size is independent from the size of the data and is dictated by being big enough to avoid collisions (e.g., where two different input data words result in the same ICV value).

The memory controller 110 is arranged to perform the write operation, including writing a representation of the data to a data area of the memory 105, and writing the ICV to an ECC area of the memory 105 that corresponds to the data area. In an example, the representation of the data is an encrypted form of the data. Thus, the memory controller 110 performs, or invokes another device to perform, encryption of the data before storing it on the memory 105. It is not necessary for the data to be encrypted, however, to gain a benefit from the ICV technique described herein. Such data integrity may be useful for data that may be known, but should not be changed in an unauthorized manner, such as operating parameters and the like.

In an example, the memory controller 110 is arranged to compute ECC information (e.g., parity bits, a Reed-Solomon (RS) code, etc.) for the data. In an example, to complete the write request, the memory controller 110 is arranged to write the ECC information to a second data area in the memory. Here, the ECC data is stored in a data area much like ICV data was stored in traditional approaches. Although this involves an additional read and write for write operations, it will not usually involve an additional read in read operations because the ICV based integrity check will usually pass, indicating that there is no error in the data, and thus the ECC data does not need to be retrieved.

In an example, to compute the ECC information, the memory controller 110 is arranged to restrict the size of the ECC information to be less than the ECC area. In an example, the ECC information is a low-density parity-check (LDPC) code, instead of an RS code, to achieve this reduction in size. Reducing the size of the ECC information may free bits in the ECC area to place the ICV. Thus, in an example, the memory controller 110 is arranged to write the ECC information into the ECC area along with the ICV.

In an example, the memory controller 110 is arranged to combine (e.g., transform) the representation of the data and the ECC information into single entity that is the ICV. This single entity ICV may then be written across the data area and the ECC area. Here, the data area and the ECC area are considered a single larger block by the memory controller 110. The ICV is enabled via the technique used to combine the representation of the data and the ECC information. In an example, the memory controller 110 is arranged to apply (e.g., invoke, employ, etc.) an error preserving, invertible, and parameterized obfuscation operator (e.g., function). In an example, a parameter of the invertible parameterized obfuscation operator is at least one of a key or a nonce. Generally, the key is used to keep the obfuscation secure while the nonce is used to provide versioning (e.g., freshness) to the obfuscation. The term obfuscation is used here to indicate that the result may be not be cryptographically secure, but rather provide a heightened burden to those attempting to retrieve or tamper with the data.

The memory controller 110 is also arranged to read the ICV upon read operations, to perform integrity checks on the data for each read request. Thus, the memory controller 110 is arranged to receive a read request for the data area and retrieve the ICV along with the representation of the data. As noted above, the retrieval of the ICV from the memory 105 is automatic when the memory 105 is an ECC memory. The memory controller 110 is arranged to evaluate the ICV to determine that the representation of the data is acceptable. This is the integrity check. If the integrity check passes, it is known that the data is both intact and error free. The memory controller 110 is arranged to return the data—e.g., after decrypting the data if the representation of the data was previously encrypted by the memory controller 110—to an originator of the read request without evaluating the ECC information in response to the determination that the representation of the data is acceptable. If, however, the integrity check does not pass, the memory controller 110 is arranged to retrieve the ECC information and attempted to correct any errors. After error correction, the integrity check may be re-run. If it fails again, the memory controller 110 may signal the requestor that it failed, or simply not complete the read request (e.g., return nothing, indicate a read failure, etc.).

Figure 2A:
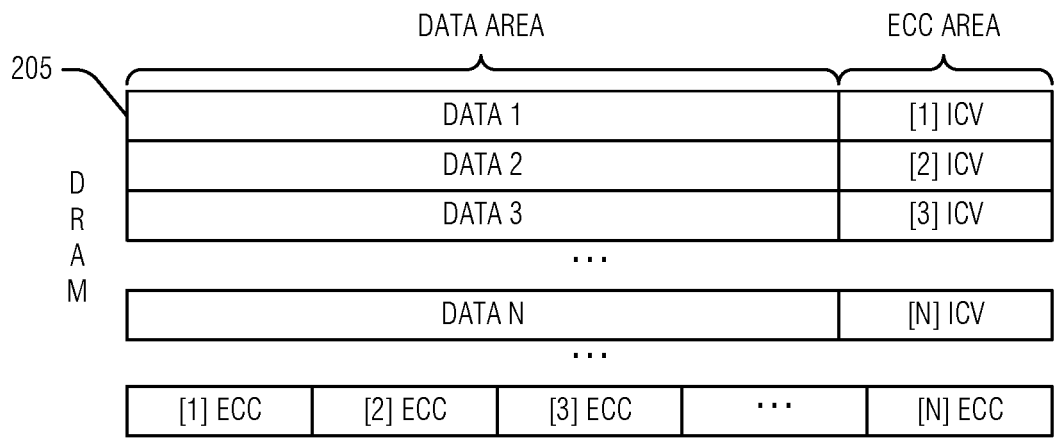
FIGS. 2A-2C illustrate data and ICV placement in memory, according to several embodiments.
Figure 2B:
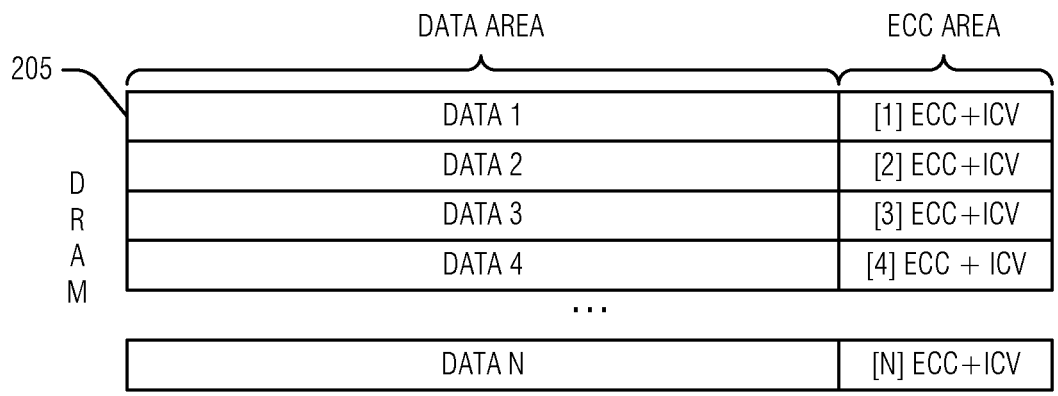

FIGS. 2A-2B illustrate data and ICV placement in memory, according to several embodiments. As illustrated, each row (e.g., row 205) is a cache line in the memory. The cache line 205 is divided into a data area (e.g., host addressable or directly usable memory storage) and an ECC area (e.g., storage designed to return several bits along with a data area). FIG. 2A illustrates an example in which the entire ECC area for the cache line 205 is used by an ICV for the corresponding data word. As illustrated, a separate cache line is used to store several sets of ECC information (e.g., ECC data).

FIG. 2B illustrates an example in which the ECC area of the cache line 205 includes both the ICV and the ECC information for the data word. In this example, the traditional ECC information is compressed, or size restricted, to make room in the ECC area for the ICV.

Figure 2C:
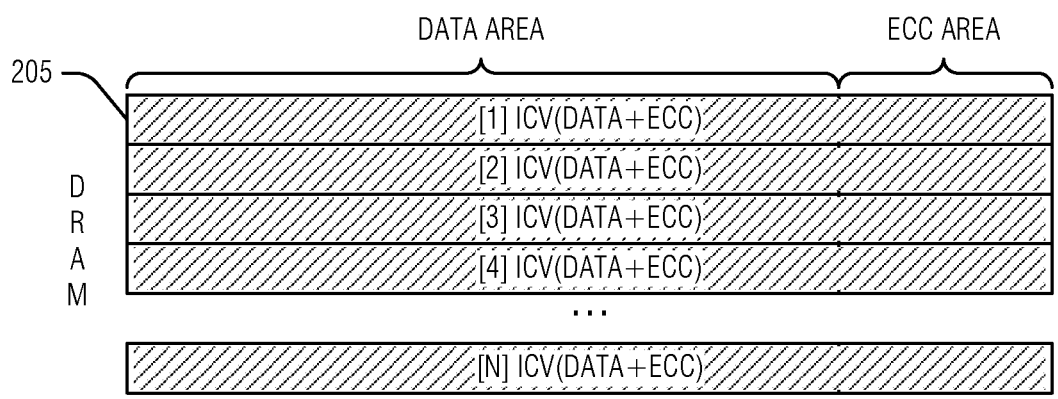

FIG. 2C illustrates an example in which the data word is combined with the ECC information in a way to produce the ICV. This is illustrated by shading the ICV, which is a combination of the data and the ECC information. The ICV is then written across the data area and the ECC area.

Figure 3:
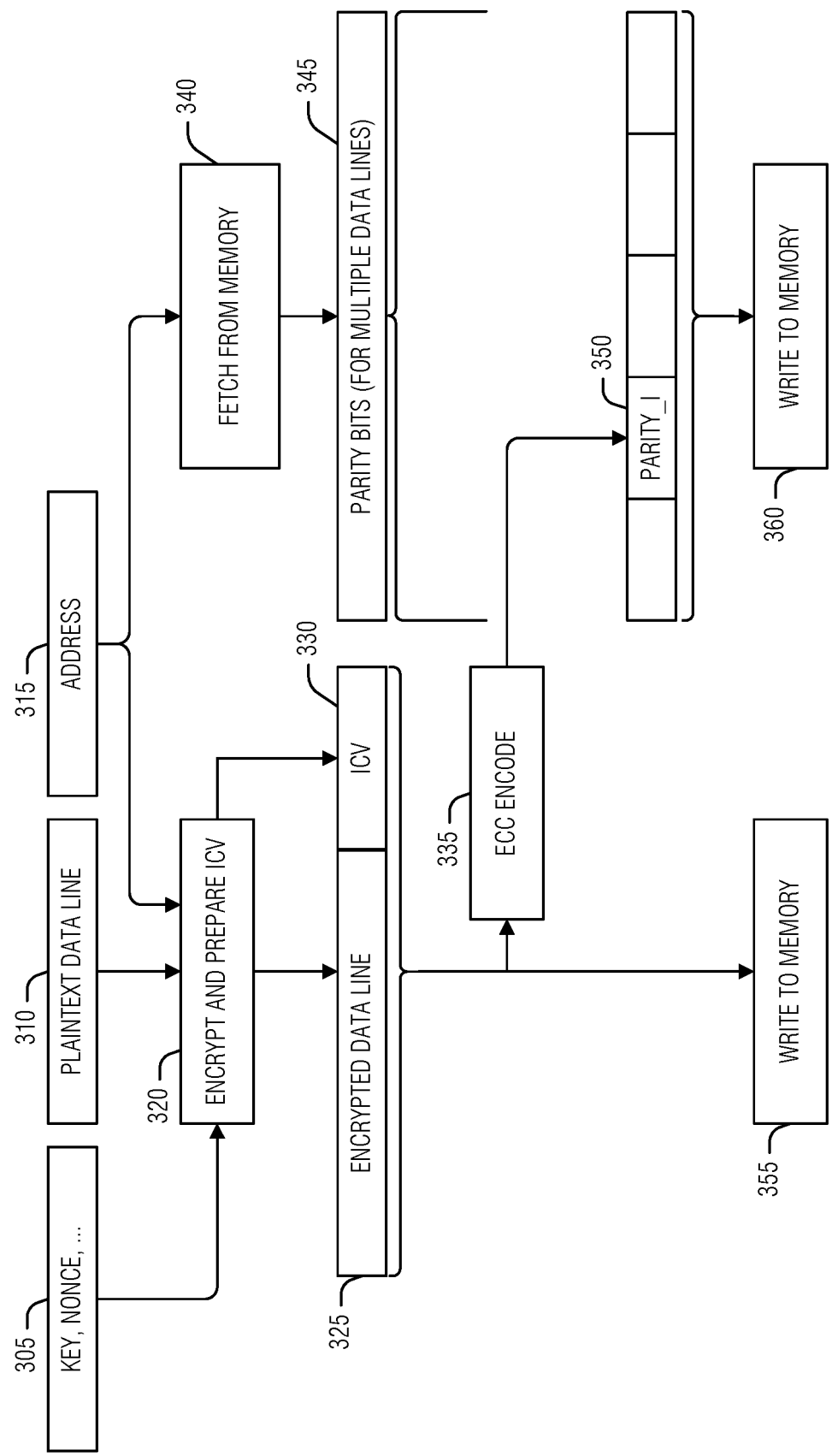
FIG. 3 illustrates an example of a component flow to place ICV data in an ECC area of memory and move ECC data to another portion of memory, according to an embodiment.

FIG. 3 illustrates an example of a component flow to place ICV data in an ECC area of memory and move ECC data to another portion of memory, according to an embodiment. This example leverages the fact that storage blocks (e.g., the blocks in memory that the memory controller may access) are greater than user blocks (e.g., the blocks in memory that the host may address). The extra bits of the storage block are the ECC area and are used here to store the ICV instead of the ECC information for the user block (e.g., data word). Also, in this example, the ECC (e.g., parity bits) are stored in a separate data area (e.g., outside of the storage block) and accessed only when an integrity check using the ICV fails when reading. Because reads are almost always error free, this provides a significant performance benefit over traditional techniques. However, in the case of an error, this technique is not worse than traditional techniques.

Illustrated here is a write operation. Encryption parameters 305 are combined with a data line 310 (e.g., data word) and address 315 to encrypt the data line and create an ICV (operation 320), resulting in an encrypted representation of the data in a cache line 325 and the ICV 330, respectively sized to occupy a data area and an ECC area of the memory. The encrypted representation of the data 325 and the ICV 330 are written to memory (operation 355).

In order to separately store the ECC information for the data line 310, a data word containing the corresponding ECC information is retrieved from memory (operation 340). ECC information is obtained from the representation of the data 325 and the ICV 330 (operation 335) and written to a portion 350 of the retrieved ECC data word 345 that corresponded to the address 315. The entire ECC data word 345 is then re-written to the memory (operation 360).

A read operation may avoid retrieving the ECC information data word 345 is the integrity check passes. Otherwise, the portion 350 of the ECC information data word 345 corresponding to the address 315 is used to perform error correction. Although a hash-based ICV is discussed above, message authenticate codes (MACs), or other integrity techniques may be employed. Replay attacks may also be thwarted via integrity trees, or the like.

Figure 4:
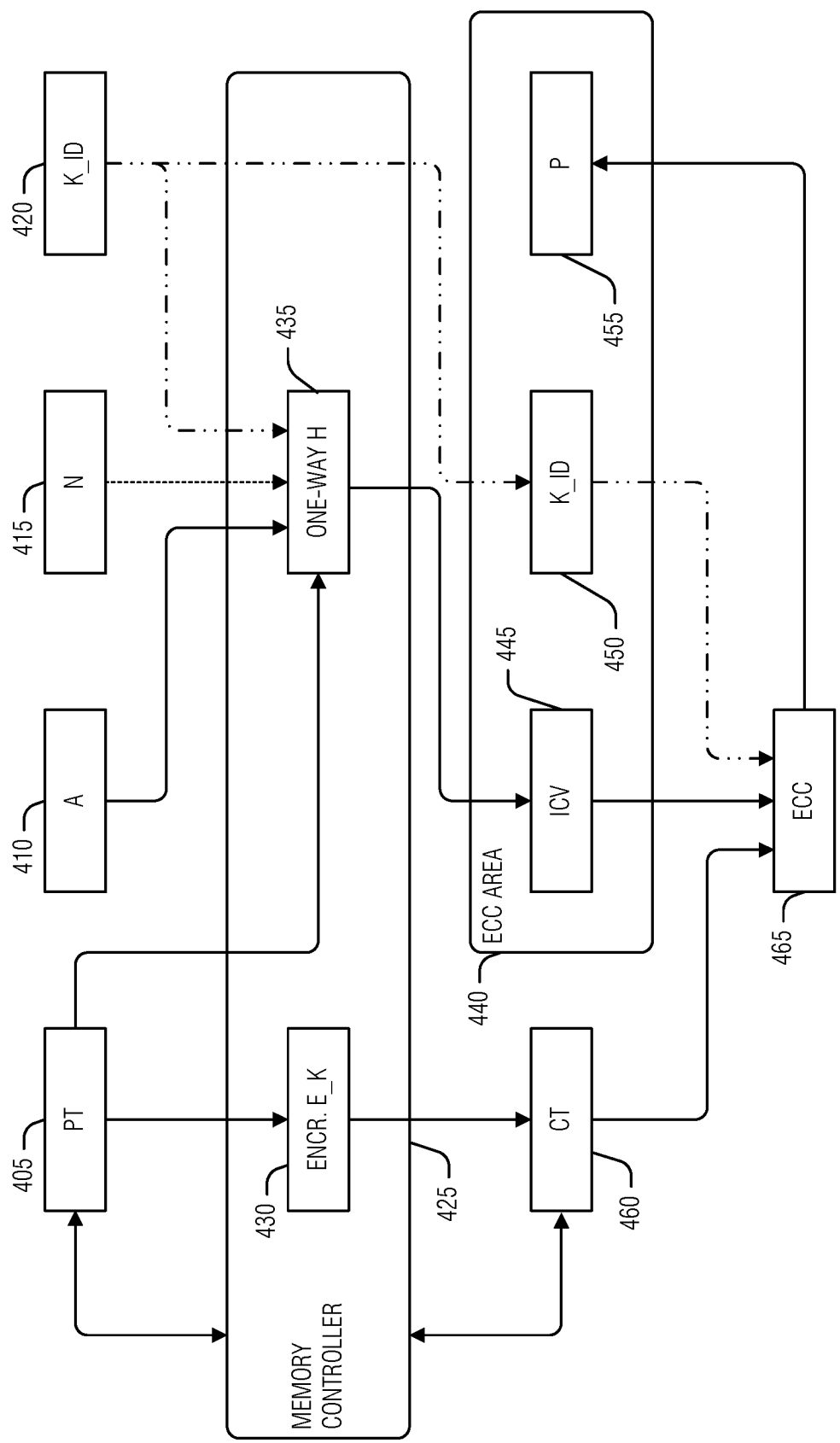
FIG. 4 illustrates an example of a component flow to place ICV data and ECC data in an ECC area of memory, according to an embodiment.

FIG. 4 illustrates an example of a component flow to place ICV data and ECC information in an ECC area of memory, according to an embodiment. For example, given an ICV of between 16 to 96 bits, and a DDR5 memory module, which has 30 bits per cache line that may be freed—for example, by disabling lane sparing and critical chunk—to increase the ECC area, the ICV may be stored in the ECC area along with ECC information. Generally, the more bits used for the ICV, the greater security. In an example, this technique may be combined with the obfuscation technique described below (e.g., with respect to FIGS. 5-7B).

The illustrated component flow is a write. The flow starts with plain text 405 in a request that includes an address 410. The nonce 415 and the key 420 are optional and may be provided to the memory controller in a variety of ways.

The plain text 405 may be encrypted (operation 430) to create cypher text 460. The plain text 405 may also be a parameter to a one-way hash 435, along with the address 410, the nonce 415, and the key 420, to produce the ICV 445, which is written to the ECC area 440. The ICV 445 and the cypher text 406 may also be ECC encoded (operation 465)—optionally also including the key 420 stored in the ECC area 450), to produce the parity bits 455. These parity bits 455 (e.g., ECC information) are then also stored in the ECC area 440.

As noted above, some cache line bits may be freed by turning off features of a memory. Also, the parity bits 455 may be restricted, for example, by using an RS code with weaker error correcting capability that needs fewer bits or replacing the traditional RS codes with more efficient codes, such as LDPC codes. Again, generally, the more cache line bits are made available (e.g., freed), the greater security the ICV may provide.

Figure 5:
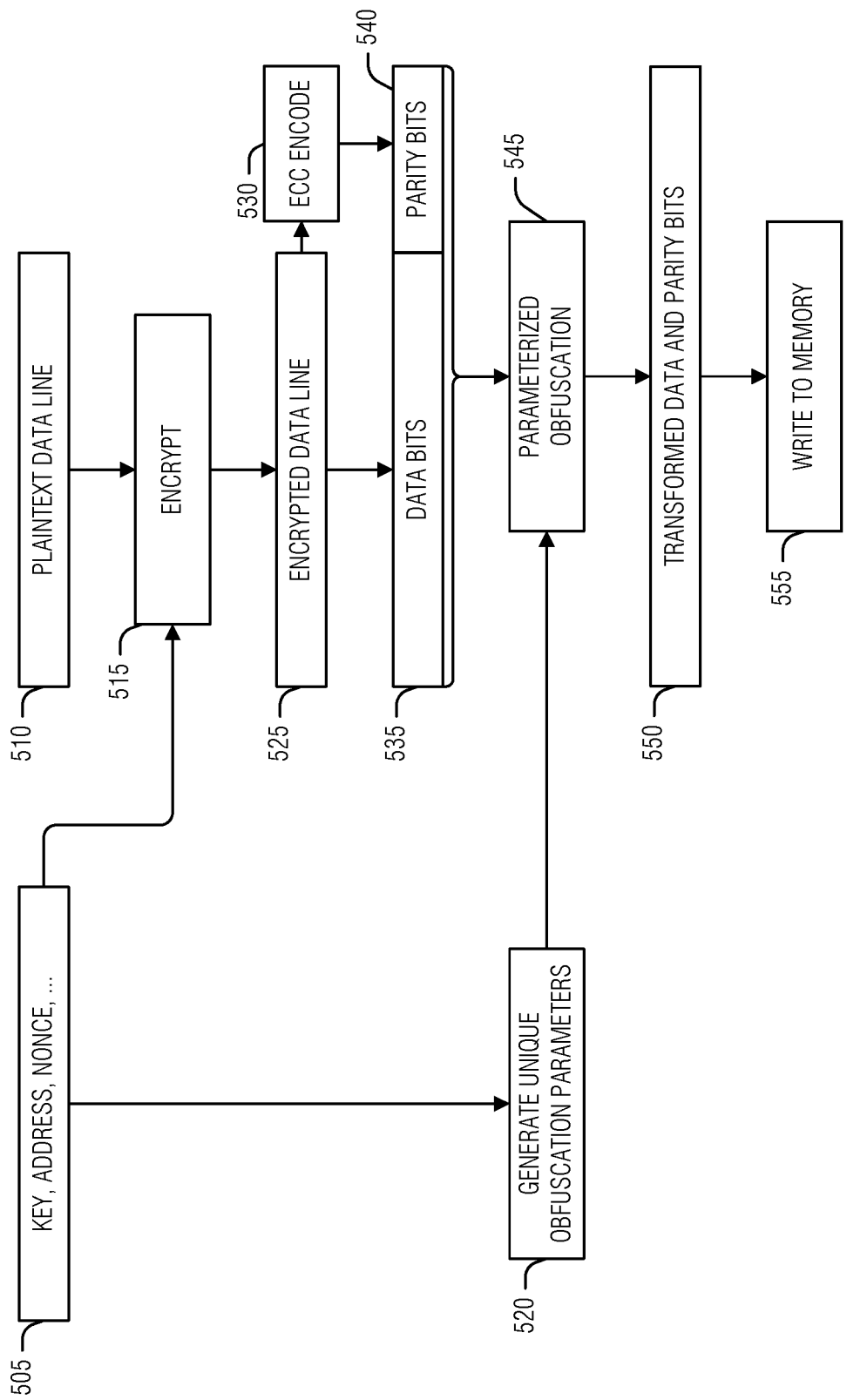
FIG. 5 illustrates an example of a component flow to obfuscate user data and ECC data to implement ICV across a data area and an ECC area of memory, according to an embodiment, according to an embodiment.

FIG. 5 illustrates an example of a component flow to obfuscate user data and ECC data to implement ICV across a data area and an ECC area of memory, according to an embodiment, according to an embodiment. In this example, an obfuscation is performed after ECC encoding. The obfuscation enables integrity and error checking. As used herein, obfuscation is a random-looking reversible transformation of data that preserves the number of errors. If memory was forged (e.g., copied from a different location), then the de-obfuscation transform will not match original obfuscation and its output will not be distinguishable from random data (e.g., from an ECC decoder's perspective). Thus, the ECC decoder will fail or report too many errors when the integrity of the data is compromised. Additional details of an example of an obfuscation operator are described below with respect to FIGS. 7A and 7B.

Component flow illustrated here describes a write operation. Parameters 505, such as the address, a key, and a nonce, are combined with the plain text data line 510 to produce an encrypted data line 525 (operation 515). Parity bits 540 are created (operation 530) from the encrypted data line 525 and placed in bit positions corresponding to an ECC data area, while the encrypted data line is placed in bit positions corresponding to a data area 535.

The parameters 505 may be used to create obfuscation parameters (operation 520). The obfuscation parameters are combined with the data bits 535 and the parity bits 540 to create a transformation 550 (operation 545). The transformation 550 is then written to memory, using both the data area and the ECC area of a storage cache line (operation 555).

Figure 6:
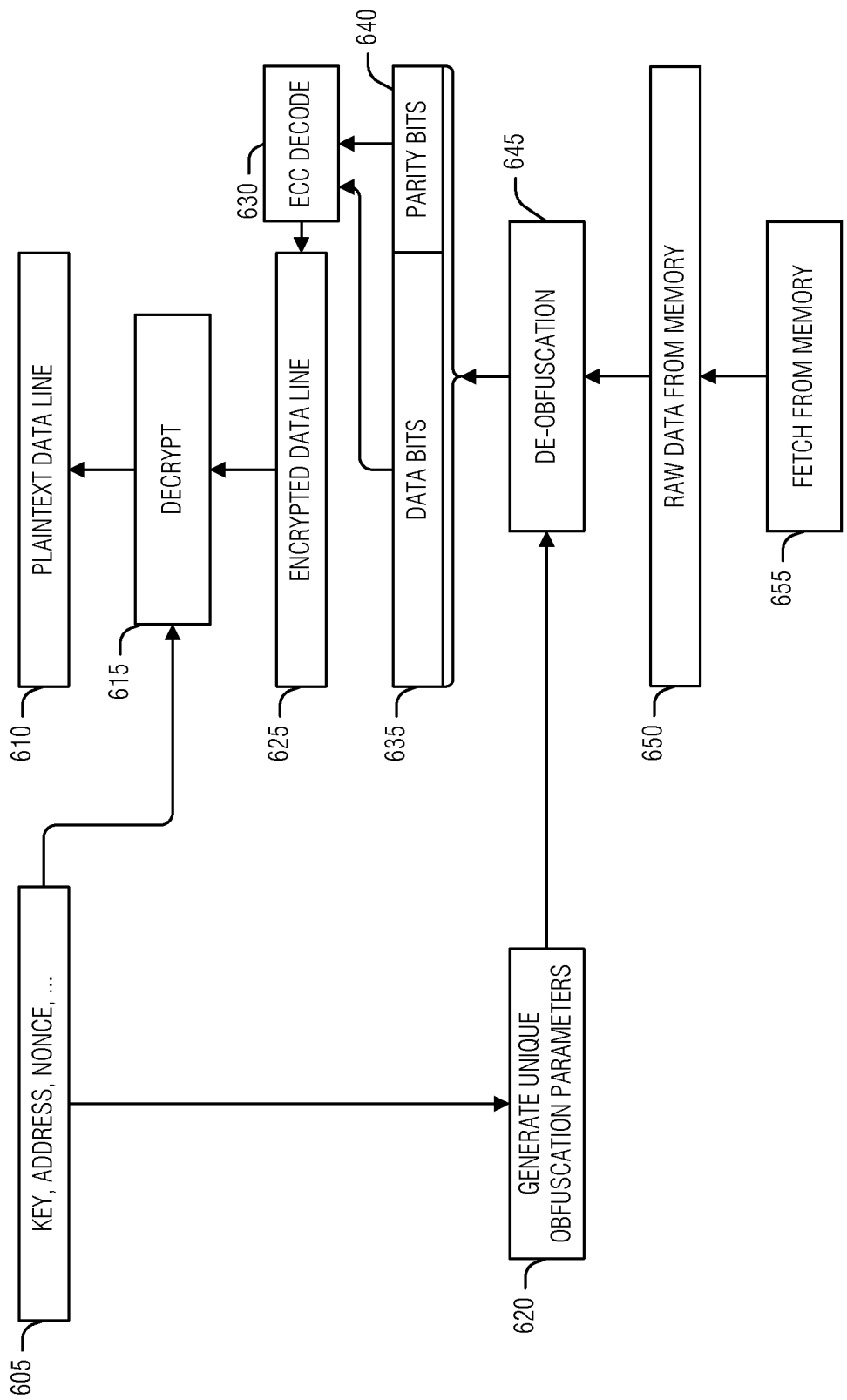
FIG. 6 illustrates an example of a component flow to de-obfuscate user data and ECC data from a data area and an ECC area of memory, according to an embodiment, according to an embodiment.

FIG. 6 illustrates an example of a component flow to de-obfuscate user data and ECC data from a data area and an ECC area of memory, according to an embodiment. Raw data 650 (e.g., an obfuscated version of data) is retrieved from memory (operation 655). The parameters 605 are used to generate obfuscation parameters (operation 620) that are used to de-obfuscate the raw data 650 (operation 645). The result includes data bits 635 and parity bits 640. The data bits 635 and the parity bits 640 are checked for errors (operation 630) and used to produce the encrypted data line 625. The parameters 605 may also be used to decrypt the encrypted data line 625 (operation 615) to produce a plaintext data line 610, which may then be returned to the requestor.

Figure 7A:
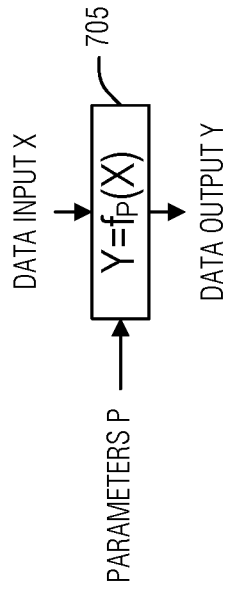
FIGS. 7A-7B illustrate an obfuscation engine, according to an embodiment.
Figure 7B:
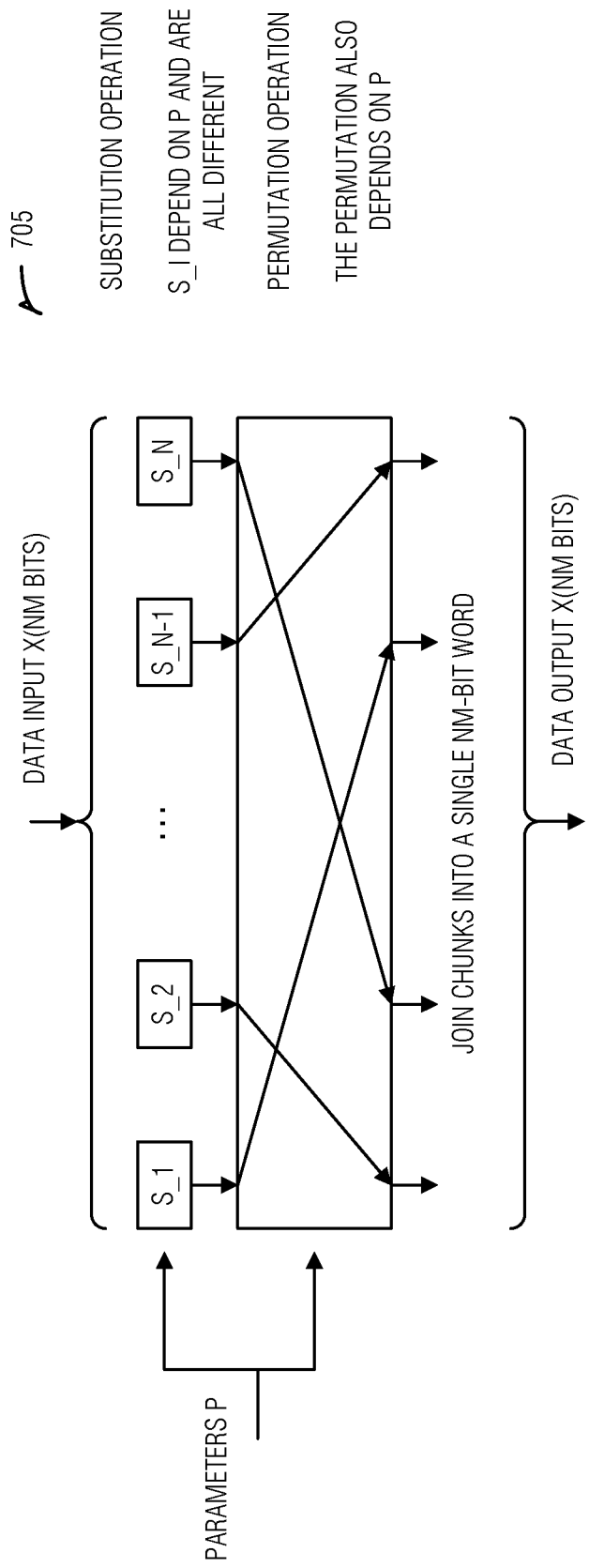

FIGS. 7A-7B illustrate an obfuscation engine, according to an embodiment. FIG. 7A illustrates an obfuscation operator 705. In this case, the obfuscation operator 705 is invertible as a transformation between data input and data output). This means that, given data output and the same parameters, the data input is restored by the obfuscation operator 705. Thus, there exists an operator $g_P$ such that $X=g_P(f_P(X))$ for all X and P. Further, the obfuscation operator 705 (and corresponding inverted operators) are error preserving. This means that a data word with N errors is transformed into a different data word with N errors. The notion of "one error" corresponds to both the physical structure of memory and that used in ECCs. Thus, the error may be a bit error, a byte (e.g., symbol) error, or an error on the level of memory banks, among others. Within these two properties (e.g., invertible and error preserving), any obfuscation operator may be used.

FIG. 7B illustrates a version of the obfuscation operator 705. In the case, data words are split into N chunks of M bits each via substitution operation. The substitution operation may apply a one-to-one (M, M)-transformation to each of the N chunks. Here, the transformations are based on the parameters P, and may be different for different chunks). The chunks are then subjected to a permutation operation that also depends on the parameters P. The class of all operators that have the form: substitution, then permutation; is the same as the class of all operators that have the form: permutation, then substitution. However, for each set of values of the parameters P, the corresponding operators of these two forms may differ.

In the extreme case of 1-bit chunks (e.g., when dealing with bit errors only), the substitution operation may become a simple masking, such as XORing data with a bitmask that is based on the parameters P. Generally, one, or even two, bit chunks may make the obfuscation operator linear, which may be vulnerable to certain attacks. An example of such an attack is a deterministic generation of vectors Y such that vector $X=g_P(Y)$ will successfully pass error correction procedure—recall that $g_P$ is the inversion of $f_P$, such that $X=g_P(f_P(X))$ for all X and P.

The substitution operation counters a malicious entity's attempt of Y=0. The permutation operation may map 0 to 0. The substitution operation works to prevent deterministic generation of an ECC codeword, such as X=0. XORing with a mask, as noted above, may cause the substitution and permutation operation to be linear (e.g., $Y=(X\oplus A)M$, where A, M, the masking vector, the permutation matrix depends on the parameters P. If an attacker knows several samples of Y for the same parameters P (e.g., by observing a specific memory location when the same key is in use), then the attacker may generate new vectors. For example, if Y', Y", and Y'" are such observations that correspond to three different inputs X', X", and X'"—which are valid ECC outputs—then $Y=Y'\oplus Y''\oplus Y'''$ will correspond to $X=X'\oplus X''\oplus X'''$, and X will also be a valid ECC output.

The permutation operation thwarts attacks against particular parity bits in a data word X. This is accomplished by repositioning the chunks during the permutation operation.

Figure 8:
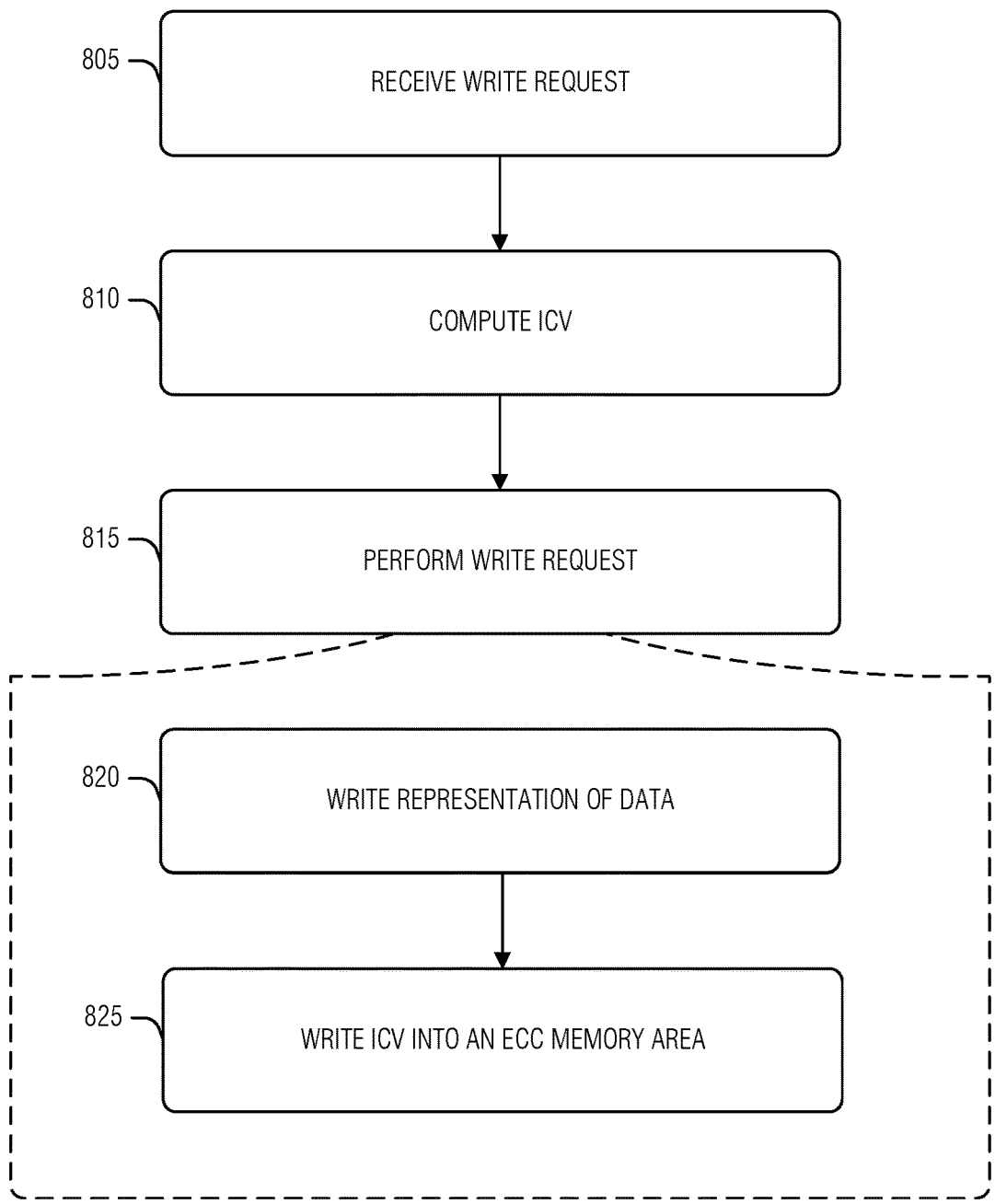
FIG. 8 illustrates a flow diagram of an example of a method for ECC memory security, according to an embodiment.

FIG. 8 illustrates a flow diagram of an example of a method 800 for ECC memory security, according to an embodiment. The operations of the method 800 are performed by hardware, such as that describe above or below (e.g., processing circuitry).

At operation 805, a write request is received. Here, the write request includes data that the requestor (e.g., user, program, etc.) intends to write to memory.

At operation 810, an ICV is computed for the data.

At operation 815, the write request is performed (e.g., the data is written to the memory). The operations 820 and 825 are completed as part of performing the write request.

At operation 820, a representation of the data is written to a data area in memory. Here, the data area addressable by a host. In an example, the data area is a cache line. In an example, the representation of the data is an encrypted form of the data.

At operation 825, the ICV is written into an ECC area in memory. The ECC area corresponds to the data area via hardware of the memory. In an example, the ECC area is retrieved along with the data area by the memory by design.

In an example, performing the write request includes computing ECC information for the data. In an example, performing the write request includes writing the ECC information to a second data area in the memory.

In an example, computing the ECC information includes restricting a size of the ECC information to be less than the ECC area. In an example, the ECC information is a low-density parity-check (LDPC) code. In an example, performing the write request includes writing the ECC information into the ECC area.

In an example, performing the write request includes combining the representation of the data and the ECC information into single entity that is the ICV. the ICV is then written across the data area and the ECC area. In an example, combining the representation of the data and the ECC information includes applying an invertible parameterized obfuscation operator that is error preserving. In an example, a parameter of the invertible parameterized obfuscation operator is at least one of a key or a nonce.

In an example, the operations of the method 800 further include receiving a read request for the data area, retrieving the ICV along with the representation of the data, evaluating the ICV to determine that the representation of the data is acceptable, and returning the data to an originator of the read request without evaluating the ECC information in response to the determination that the representation of the data is acceptable.

Figure 9:
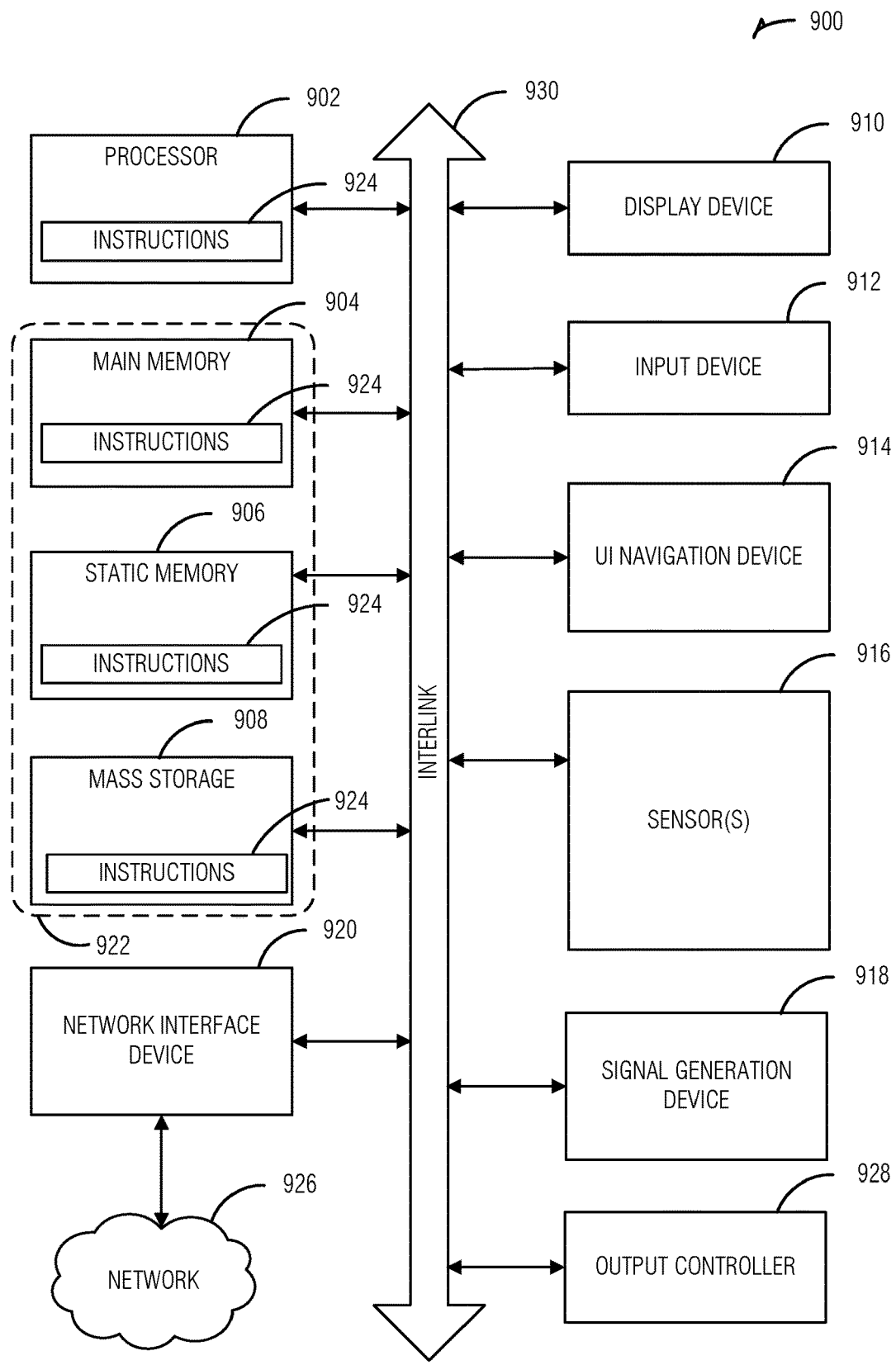
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may perform. Examples, as described herein, may include, or may operate by, logic or a number of components, or mechanisms in the machine 900. Circuitry (e.g., processing circuitry) is a collection of circuits implemented in tangible entities of the machine 900 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 900 follow.

In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 900 may include a hardware processor 902 (e.g., a central processing unit (CPU), a graphics processing unit (GPU), a hardware processor core, or any combination thereof), a main memory 904, a static memory (e.g., memory or storage for firmware, microcode, a basic-input-output (BIOS), unified extensible firmware interface (UEFI), etc.) 906, and mass storage 908 (e.g., hard drive, tape drive, flash storage, or other block devices) some or all of which may communicate with each other via an interlink (e.g., bus) 930. The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 908, a signal generation device 918 (e.g., a speaker), a network interface device 920, and one or more sensors 916, such as a global positioning system (GPS) sensor, compass, accelerometer, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 902, the main memory 904, the static memory 906, or the mass storage 908 may be, or include, a machine readable medium 922 on which is stored one or more sets of data structures or instructions 924 (e.g., software) embodying or utilized by any one or more of the techniques or functions described herein. The instructions 924 may also reside, completely or at least partially, within any of registers of the processor 902, the main memory 904, the static memory 906, or the mass storage 908 during execution thereof by the machine 900. In an example, one or any combination of the hardware processor 902, the main memory 904, the static memory 906, or the mass storage 908 may constitute the machine readable media 922. While the machine readable medium 922 is illustrated as a single medium, the term "machine readable medium" may include a single medium or multiple media (e.g., a centralized or distributed database, and/or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 may be further transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software. A transmission medium is a machine readable medium.

Additional Notes & Examples

Example 1 is a memory controller for error correction code (ECC) memory security, the memory controller comprising: a machine readable medium including instructions; and processing circuitry that, when executing the instructions, operates to: receive a write request, the write request including data; compute an integrity check value (ICV) for the data; perform the write request including: write a representation of the data to a data area in memory, the data area addressable by a host; and write the ICV into an ECC area in memory, the ECC area corresponding to the data area via hardware of the memory.

In Example 2, the subject matter of Example 1, wherein, to perform the write request, the processing circuitry computes ECC information for the data.

In Example 3, the subject matter of Example 2, wherein, to perform the write request, the processing circuitry writes the ECC information to a second data area in the memory.

In Example 4, the subject matter of any of Examples 2-3, wherein, to compute the ECC information, the processing circuitry restricts a size of the ECC information to be less than the ECC area.

In Example 5, the subject matter of Example 4, wherein the ECC information is a low-density parity-check (LDPC) code.

In Example 6, the subject matter of any of Examples 4-5, wherein, to perform the write request, the processing circuitry writes the ECC information into the ECC area.

In Example 7, the subject matter of any of Examples 2-6, wherein, to perform the write request, the processing circuitry: combines the representation of the data and the ECC information into single entity that is the ICV; and writes the ICV across the data area and the ECC area.

In Example 8, the subject matter of Example 7, wherein, to combine the representation of the data and the ECC information, the processing circuitry applies an invertible parameterized obfuscation operator that is error preserving.

In Example 9, the subject matter of Example 8, wherein a parameter of the invertible parameterized obfuscation operator is at least one of a key or a nonce.

In Example 10, the subject matter of any of Examples 1-9, wherein the representation of the data is an encrypted form of the data.

In Example 11, the subject matter of any of Examples 1-10, wherein the data area is a cache line.

In Example 12, the subject matter of any of Examples 1-11, wherein the ECC area is retrieved along with the data area by the memory by design.

In Example 13, the subject matter of any of Examples 1-12, wherein the instructions cause the processing circuitry to: receive a read request for the data area; retrieve the ICV along with the representation of the data; evaluate the ICV to determine that the representation of the data is acceptable; and returning the data to an originator of the read request without evaluating the ECC information in response to the determination that the representation of the data is acceptable.

Example 14 is a method for error correction code (ECC) memory security, the method comprising: receiving a write request, the write request including data; computing an integrity check value (ICV) for the data; performing the write request including: writing a representation of the data to a data area in memory, the data area addressable by a host; and writing the ICV into an ECC area in memory, the ECC area corresponding to the data area via hardware of the memory.

In Example 15, the subject matter of Example 14, wherein performing the write request includes computing ECC information for the data.

In Example 16, the subject matter of Example 15, wherein performing the write request includes writing the ECC information to a second data area in the memory.

In Example 17, the subject matter of any of Examples 15-16, wherein computing the ECC information includes restricting a size of the ECC information to be less than the ECC area.

In Example 18, the subject matter of Example 17, wherein the ECC information is a low-density parity-check (LDPC) code.

In Example 19, the subject matter of any of Examples 17-18, wherein performing the write request includes writing the ECC information into the ECC area.

In Example 20, the subject matter of any of Examples 15-19, wherein performing the write request includes: combining the representation of the data and the ECC information into single entity that is the ICV; and writing the ICV across the data area and the ECC area.

In Example 21, the subject matter of Example 20, wherein combining the representation of the data and the ECC information includes applying an invertible parameterized obfuscation operator that is error preserving.

In Example 22, the subject matter of Example 21, wherein a parameter of the invertible parameterized obfuscation operator is at least one of a key or a nonce.

In Example 23, the subject matter of any of Examples 14-22, wherein the representation of the data is an encrypted form of the data.

In Example 24, the subject matter of any of Examples 14-23, wherein the data area is a cache line.

In Example 25, the subject matter of any of Examples 14-24, wherein the ECC area is retrieved along with the data area by the memory by design.

In Example 26, the subject matter of any of Examples 14-25, comprising: receiving a read request for the data area; retrieving the ICV along with the representation of the data; evaluating the ICV to determine that the representation of the data is acceptable; and returning the data to an originator of the read request without evaluating the ECC information in response to the determination that the representation of the data is acceptable.

Example 27 is a method for error correction code (ECC) memory security, the method comprising: receiving a write request, the write request including data; computing an integrity check value (ICV) for the data; performing the write request including: writing the data to a data area in memory, the data area addressable by a host; writing the ICV into an ECC area in memory, the ECC area corresponding to the data area via hardware of the memory; and writing ECC data for the data to an ECC data area, wherein the ECC data area is a another data area that corresponds to the data area and holds ECC data.

Example 28 is a method for error correction code (ECC) memory security, the method comprising: receiving a write request, the write request including data; performing the write request including: writing the data to a data buffer that corresponds to a data area in memory, the data area addressable by a host; writing ECC data into an ECC buffer that corresponds to an ECC area in memory, the ECC area corresponding to the data area via hardware of the memory; performing an obfuscation on the data buffer and the ECC buffer to produce an integrity check value (ICV), the obfuscation being reversible; and writing the obfuscation to the data area and the ECC area.

Example 29 is a method for error correction code (ECC) memory security, the method comprising: receiving a write request, the write request including data; computing an integrity check value (ICV) for the data; computing ECC data for the data; performing the write request including: writing the data to a data area in memory, the data area addressable by a host; and writing both the ECC data and the ICV into an ECC area in memory, the ECC area corresponding to the data area via hardware of the memory.

Example 30 is at least one machine readable medium including instructions for error correction code (ECC) memory security, the instructions, when executed by a machine, cause the machine to perform operations comprising: receiving a write request, the write request including data; computing an integrity check value (ICV) for the data; performing the write request including: writing a representation of the data to a data area in memory, the data area addressable by a host; and writing the ICV into an ECC area in memory, the ECC area corresponding to the data area via hardware of the memory.

In Example 31, the subject matter of Example 30, wherein performing the write request includes computing ECC information for the data.

In Example 32, the subject matter of Example 31, wherein performing the write request includes writing the ECC information to a second data area in the memory.

In Example 33, the subject matter of any of Examples 31-32, wherein computing the ECC information includes restricting a size of the ECC information to be less than the ECC area.

In Example 34, the subject matter of Example 33, wherein the ECC information is a low-density parity-check (LDPC) code.

In Example 35, the subject matter of any of Examples 33-34, wherein performing the write request includes writing the ECC information into the ECC area.

In Example 36, the subject matter of any of Examples 31-35, wherein performing the write request includes: combining the representation of the data and the ECC information into single entity that is the ICV; and writing the ICV across the data area and the ECC area.

In Example 37, the subject matter of Example 36, wherein combining the representation of the data and the ECC information includes applying an invertible parameterized obfuscation operator that is error preserving.

In Example 38, the subject matter of Example 37, wherein a parameter of the invertible parameterized obfuscation operator is at least one of a key or a nonce.

In Example 39, the subject matter of any of Examples 30-38, wherein the representation of the data is an encrypted form of the data.

In Example 40, the subject matter of any of Examples 30-39, wherein the data area is a cache line.

In Example 41, the subject matter of any of Examples 30-40, wherein the ECC area is retrieved along with the data area by the memory by design.

In Example 42, the subject matter of any of Examples 30-41, wherein the operations include: receiving a read request for the data area; retrieving the ICV along with the representation of the data; evaluating the ICV to determine that the representation of the data is acceptable; and returning the data to an originator of the read request without evaluating the ECC information in response to the determination that the representation of the data is acceptable.

Example 43 is a system for error correction code (ECC) memory security, the system comprising: means for receiving a write request, the write request including data; means for computing an integrity check value (ICV) for the data; means for performing the write request including: means for writing a representation of the data to a data area in memory, the data area addressable by a host; and means for writing the ICV into an ECC area in memory, the ECC area corresponding to the data area via hardware of the memory.

In Example 44, the subject matter of Example 43, wherein the means for performing the write request include means for computing ECC information for the data.

In Example 45, the subject matter of Example 44, wherein the means for performing the write request include means for writing the ECC information to a second data area in the memory.

In Example 46, the subject matter of any of Examples 44-45, wherein the means for computing the ECC information include means for restricting a size of the ECC information to be less than the ECC area.

In Example 47, the subject matter of Example 46, wherein the ECC information is a low-density parity-check (LDPC) code.

In Example 48, the subject matter of any of Examples 46-47, wherein the means for performing the write request include means for writing the ECC information into the ECC area.

In Example 49, the subject matter of any of Examples 44-48, wherein the means for performing the write request include: means for combining the representation of the data and the ECC information into single entity that is the ICV; and means for writing the ICV across the data area and the ECC area.

In Example 50, the subject matter of Example 49, wherein the means for combining the representation of the data and the ECC information include means for applying an invertible parameterized obfuscation operator that is error preserving.

In Example 51, the subject matter of Example 50, wherein a parameter of the invertible parameterized obfuscation operator is at least one of a key or a nonce.

In Example 52, the subject matter of any of Examples 43-51, wherein the representation of the data is an encrypted form of the data.

In Example 53, the subject matter of any of Examples 43-52, wherein the data area is a cache line.

In Example 54, the subject matter of any of Examples 43-53, wherein the ECC area is retrieved along with the data area by the memory by design.

In Example 55, the subject matter of any of Examples 43-54, comprising: means for receiving a read request for the data area; means for retrieving the ICV along with the representation of the data; means for evaluating the ICV to determine that the representation of the data is acceptable; and returning the data to an originator of the read request without evaluating the ECC information in response to the determination that the representation of the data is acceptable.

Example 56 is at least one machine-readable medium including instructions that, when executed by processing circuitry, cause the processing circuitry to perform operations to implement of any of Examples 1-55.

Example 57 is an apparatus comprising means to implement of any of Examples 1-55.

Example 58 is a system to implement of any of Examples 1-55.

Example 59 is a method to implement of any of Examples 1-55.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

The invention claimed is:

1. A memory controller for error correction code (ECC) memory security, the memory controller comprising:
   a machine-readable medium including instructions; and
   processing circuitry that, when executing the instructions, operates to:
      receive a write request, the write request including data;
      compute an integrity check value (ICV) for the data;

perform the write request including:
   write a representation of the data to a data area in memory, the data area addressable by a host; and
   write the ICV into an ECC area in the memory, the ECC area corresponding to the data area via dedicated hardware of the memory such that the ECC area is retrieved with the data area without additional requests to the memory.

2. The memory controller of claim 1, wherein, to perform the write request, the processing circuitry computes ECC information for the data.

3. The memory controller of claim 2, wherein, to perform the write request, the processing circuitry writes the ECC information to a second data area in the memory.

4. The memory controller of claim 2, wherein, to compute the ECC information, the processing circuitry restricts a size of the ECC information to be less than the ECC area.

5. The memory controller of claim 4, wherein the ECC information is a low-density parity-check (LDPC) code.

6. The memory controller of claim 4, wherein, to perform the write request, the processing circuitry writes the ECC information into the ECC area.

7. The memory controller of claim 2, wherein, to perform the write request, the processing circuitry:
   combines the representation of the data and the ECC information into single entity that is the ICV; and
   writes the ICV across the data area and the ECC area.

8. The memory controller of claim 7, wherein, to combine the representation of the data and the ECC information, the processing circuitry applies an invertible parameterized obfuscation operator that is error preserving.

9. A method for error correction code (ECC) memory security, the method comprising:
   Receiving, at a memory controller, a write request, the write request including data;
   Computing, by the memory controller, an integrity check value (ICV) for the data;
   Performing, by the memory controller, the write request including:
      writing a representation of the data to a data area in memory, the data area addressable by a host; and
      writing the ICV into an ECC area in memory, the ECC area corresponding to the data area via dedicated hardware of the memory such that the ECC area is retrieved with the data area without additional requests to the memory.

10. The method of claim 9, wherein performing the write request includes computing ECC information for the data.

11. The method of claim 10, wherein performing the write request includes writing the ECC information to a second data area in the memory.

12. The method of claim 10, wherein computing the ECC information includes restricting a size of the ECC information to be less than the ECC area.

13. The method of claim 12, wherein the ECC information is a low-density parity-check (LDPC) code.

14. The method of claim 12, wherein performing the write request includes writing the ECC information into the ECC area.

15. The method of claim 10, wherein performing the write request includes:
   combining the representation of the data and the ECC information into single entity that is the ICV; and
   writing the ICV across the data area and the ECC area.

16. The method of claim 15, wherein combining the representation of the data and the ECC information includes applying an invertible parameterized obfuscation operator that is error preserving.

17. At least one non-transitory machine-readable medium including instructions for error correction code (ECC) memory security, the instructions, when executed by a machine, cause the machine to perform operations comprising:
   receiving a write request, the write request including data;
   computing an integrity check value (ICV) for the data;
   performing the write request including:
      writing a representation of the data to a data area in memory, the data area addressable by a host; and
      writing the ICV into an ECC area in memory, the ECC area corresponding to the data area via dedicated hardware of the memory such that the ECC area is retrieved with the data area without additional requests to the memory.

18. The at least one machine-readable medium of claim 17, wherein performing the write request includes computing ECC information for the data.

19. The at least one machine-readable medium of claim 18, wherein performing the write request includes writing the ECC information to a second data area in the memory.

20. The at least one machine-readable medium of claim 18, wherein computing the ECC information includes restricting a size of the ECC information to be less than the ECC area.

21. The at least one machine-readable medium of claim 20, wherein the ECC information is a low-density parity-check (LDPC) code.

22. The at least one machine-readable medium of claim 20, wherein performing the write request includes writing the ECC information into the ECC area.

23. The at least one machine-readable medium of claim 18, wherein performing the write request includes:
   combining the representation of the data and the ECC information into single entity that is the ICV; and
   writing the ICV across the data area and the ECC area.

24. The at least one machine-readable medium of claim 23, wherein combining the representation of the data and the ECC information includes applying an invertible parameterized obfuscation operator that is error preserving.

* * * * *